United States Patent [19]
Lee

[11] Patent Number: 6,124,196
[45] Date of Patent: Sep. 26, 2000

[54] VARIABLE CIRCUIT CONNECTOR AND METHOD OF FABRICATING THE SAME

[75] Inventor: Sang Chun Lee, Chungcheongbuk-do, Rep. of Korea

[73] Assignee: Hyundai Electronics Industries Co., Ltd., Chungcheongbuk-Do, Rep. of Korea

[21] Appl. No.: 09/273,512

[22] Filed: Mar. 22, 1999

[30] Foreign Application Priority Data

Mar. 24, 1998 [KR] Rep. of Korea ............ 98-10139

[51] Int. Cl.[7] ............................................. H01L 21/4763
[52] U.S. Cl. .......................... 438/618; 438/128; 438/514
[58] Field of Search ................................. 438/131, 128, 438/132, 467, 152, 919, 618; 257/529

[56] References Cited

U.S. PATENT DOCUMENTS

| | | | |
|---|---|---|---|
| 3,915,755 | 10/1975 | Goetzberger et al. | 148/1.5 CP |
| 4,233,671 | 11/1980 | Gerzberg et al. | 365/105 |
| 4,373,165 | 2/1983 | Tasch, Jr. | 357/13 |
| 5,354,704 | 10/1994 | Yang et al. | 437/52 |

OTHER PUBLICATIONS

J. Otterstedt et al., Session 7: Reconfiguration–B, 1994 International Conference on Wafer Scale Integration pp. 315–323.

Laser Repair of Faulty Packaged VLSI Chips, Electronics Letters Nov. 1988 vol. 24 No. 24 pp. 1474–1475.

*Primary Examiner*—Richard Elms
*Assistant Examiner*—Bradley K. Smith

[57] ABSTRACT

Method for forming a variable circuit connector in a wafer having a plurality of circuit modules, is disclosed, which allows selective cut-off and connection between circuit modules, including the steps of forming an insulating layer on an entire surface of the wafer inclusive of a plurality of connecting layers connected to terminals on the circuit modules, and injecting conductive ions into the insulating layer between the connecting layers intended to connect to each other.

11 Claims, 3 Drawing Sheets

VARIABLE CIRCUIT CONNECTOR AND METHOD OF FABRICATING THE SAME

BACKGROUND OF THE INVENTION

1. Field of the Invention

The present invention relates to a semiconductor device and method of fabricating the same, and more particularly, to a variable circuit connector which allows selective cut-off and connection between circuit modules and method of forming the same.

2. Discussion of the Related Art

FIG. 1 illustrates a conceptual drawing for explaining a background art connector positioned between semiconductor circuit modules. In general, a wafer fabricated with a plurality modules thereon is tested before packaging. After the test, circuit modules which are determined to be defective should be cut-off. That is, after testing modules, circuit modules that are determined to be defective and circuit modules that operate properly but should not be connected to any other circuit modules are cut-off.

Each module has input and output points (inclusive of pads) on the circuit that are connected by a fuse 11. The fuse 11, connecting the circuit modules, is used to control the connection of a module to other modules. A fuse 11 is cut to isolate a defective or otherwise separated module according to the following two methods: (1) flowing an overcurrent through the fuse connected to the circuit module intended to cut-off, and (2) directing a laser beam to the connection point(fuse) between the circuit modules to burn the fuse off. Thus, circuit modules which are determined to be defective and circuit modules which should not be connected to any other circuit modules are cut-off using the aforementioned methods. However, connection between the required circuit modules after completion of this testing is sometimes impossible, reducing selectivity and overall yield.

SUMMARY OF THE INVENTION

The present invention is directed to a variable circuit connector and a method of forming the same that substantially obviate one or more of the above and other problems due to limitations and disadvantages of the related art.

An object of the present invention is to provide a variable circuit connector and a method of forming the same which are capable of selectively connecting circuit modules after the circuit modules are tested.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the method for forming a variable circuit connector in a wafer having a plurality of circuit modules, includes the steps of forming an insulating layer on an entire surface of the wafer inclusive of a plurality of connecting layers connected to terminals on the circuit modules, and injecting conductive ions into the insulating layer between the connecting layers intended to connect to each other.

In addition, the variable circuit connector includes a variable circuit connector for connecting at least two circuit modules plural distinct connecting layers connected to terminals on the circuit modules, and the variable circuit connector including a separating layer separating the distinct connecting layers, the layer enabling electrical connection between at least two distinct connecting layers. The separating layer is an insulating layer that is selectively biased to enable electrical connection between at least two distinct connecting layers, the insulating layer having selective portions that include conductive ions used to enable the electrical connection between the distinct connecting layers. The insulating layer is fabricated from at least one of silicon oxide and silicon. The insulating layer may also include ions of a conductivity type opposite the conductive ions enabling electrical connection between the distinct connecting layers, which second ions neutralize the conductivity ions to prevent a flow of charge between the distinct connecting layers.

It is to be understood that both the foregoing general description and the following detailed description are exemplary and explanatory and are intended to provide further explanation of the invention as claimed. Thus, it should be understood that the detailed description and specific examples, while indicating preferred embodiments of the invention, are given by way of example only. Various changes and modifications that are within the spirit and scope of the invention will become apparent to those skilled in the art from this detailed description. In fact, other objects, features and characteristics of the present invention; methods, operation, and functions of the related elements of the structure; combinations of parts; and economies of manufacture will surely become apparent from the following detailed description of the preferred embodiments and accompanying drawings, all of which form a part of this specification, wherein like reference numerals designate corresponding parts in various figures.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention in the drawings, wherein.

DETAILED DESCRIPTION OF THE PREFERRED EMBODIMENT

Reference will now be made in detail to the preferred embodiments of the present invention, examples of which are illustrated in the accompanying drawings.

Figure 1:
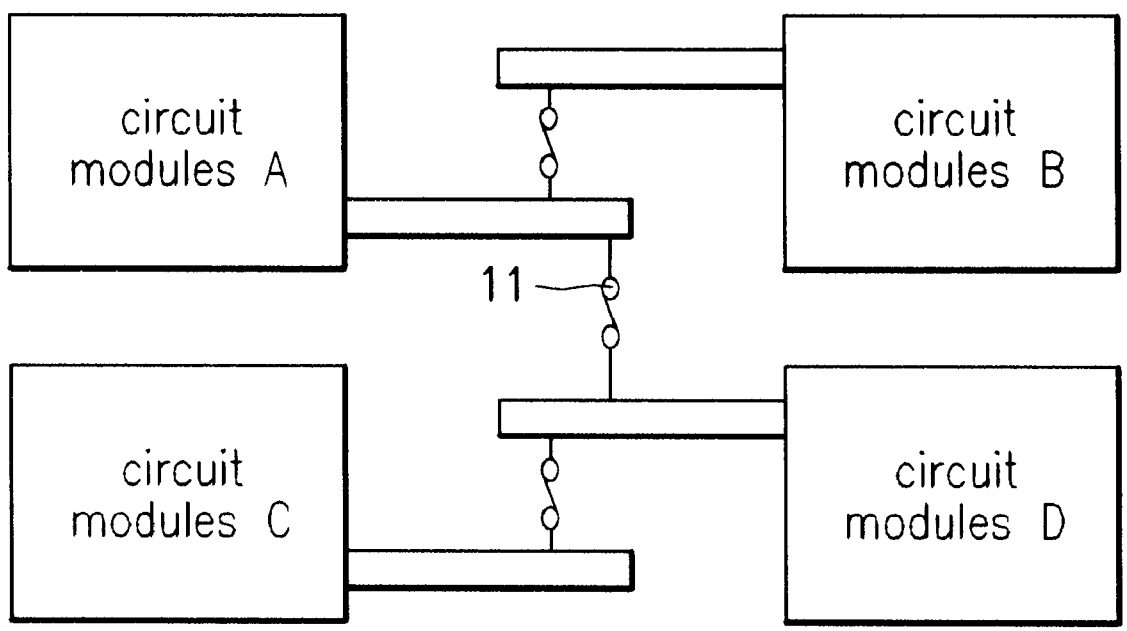
FIG. 1 illustrates a conceptual drawing for explaining a background art connector between semiconductor circuit modules.
Figure 2A:
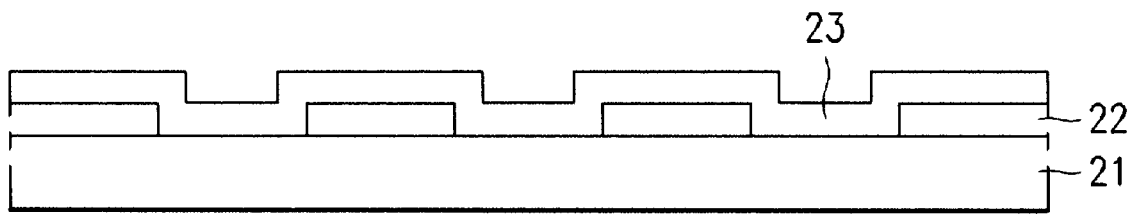
FIGS. 2A–2C illustrate sectional views of a variable circuit connector illustrating a method for forming that variable circuit connector in accordance with a first preferred embodiment of the present invention; and, FIGS. 3A–3C illustrate sectional views of a variable circuit connector illustrating a method for forming that variable circuit connector in accordance with a second preferred embodiment of the present invention.
Figure 2B:
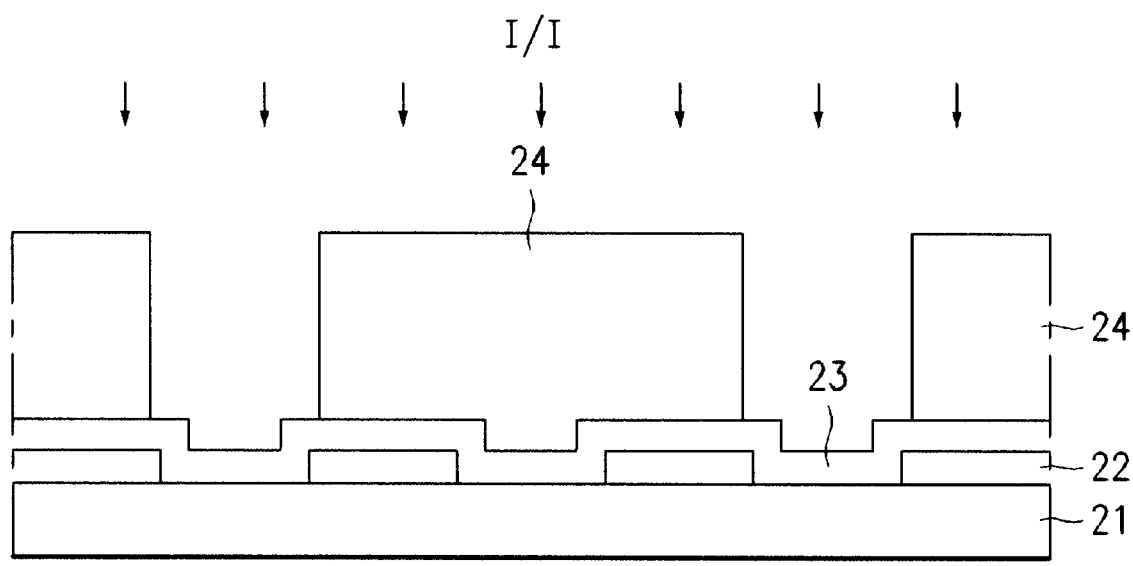
Figure 2C:
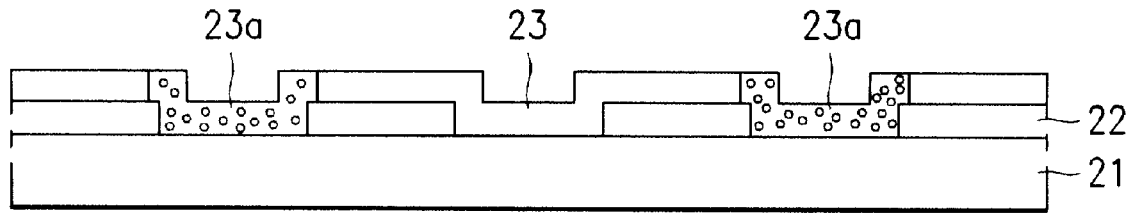

FIGS. 2A–2C illustrate sectional views of a variable circuit connector illustrating a method for forming that variable circuit connector in accordance with a first preferred embodiment of the present invention.

Referring to FIG. 2A, the method starts with the step of forming an insulating layer 23 on a wafer 21 having a plurality of connecting layers 22 formed thereon. Each of the connecting layers 22 is a conductor connected to a terminal on the circuit module, inclusive of pads. Thus, in the present invention, there are a plurality of circuit modules which are independent from each other on a wafer.

Entire background art circuit modules are connected with fuses, and when unnecessary circuit modules are intended to be cut off as a result of a test, the fuses connected to the unnecessary circuit modules are cut off selectively. By contrast, in the present invention, circuit modules are fabricated independently from the beginning and connected by selectively injecting ions into portions of circuit system.

That is, the insulating layer 23 is formed on an entire surface of the wafer 21 inclusive of the plurality of independently formed connecting layers 22. In a later step, portions of the insulating layer 23 are used, where appropriate, as connectors for electrically connecting the connecting layers 22 spaced apart from each other. The insulating layer 23 is formed of silicon oxide or an insulating film which acts as a conductor upon injection of silicon or a conductive ions.

Then, as shown in FIG. 2B, a photoresist film 24 is coated on the insulating layer 23 and subjected to patterning by exposure and development to open (or expose) portions of the insulating layer 23 between the connecting layers 22 which are intended to be connected. That is, portions of the insulating layer 23 are masked in regions where adjacent connecting layers 22 are intended to remain isolated, and portions of the insulating layer 23 are opened (or exposed) in regions where adjacent connecting layers 22 are intended to be electrically connected. When the connecting layers 22 are not connected to each other, but are instead left independent, at least one of the circuit modules are defective or unnecessary in view of the circuit system. Though a laser beam or overcurrent is used for cutting off defective or unnecessary circuit modules in the background art, the method of the present invention requires no process of cutting. That is, referring to FIG. 2B, the patterned photoresist film 24 is used as a mask to enable the N type or P type ions to be selectively injected into the portions of the insulating layer 22 that are exposed, but not into the masked portions of the insulating layer 22.

As shown in FIG. 2C, when heat treated, the N or P type ion injected insulating layer 23 becomes conductive, i.e., becomes connectors 23A, for electrically connecting adjacent connecting layers 22.

Figure 3A:
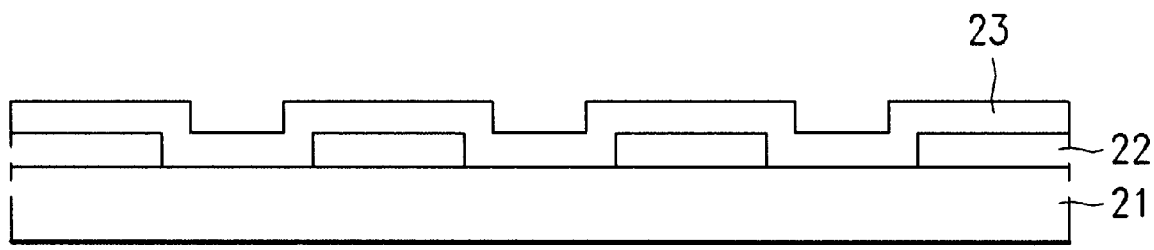
Figure 3B:
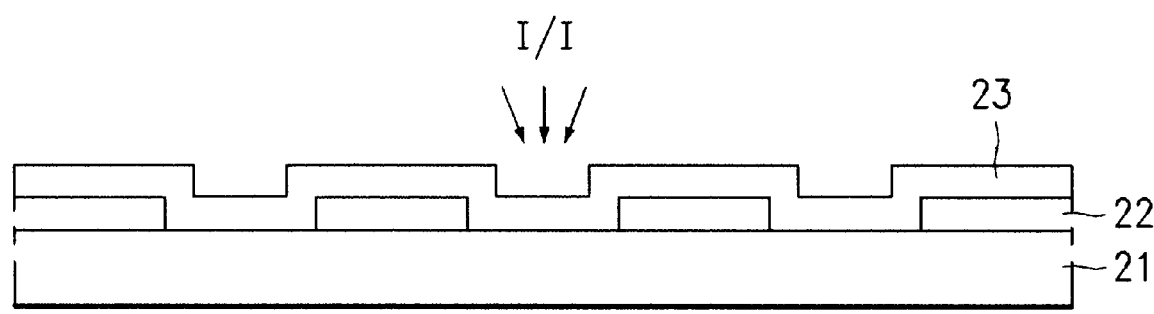
Figure 3C:
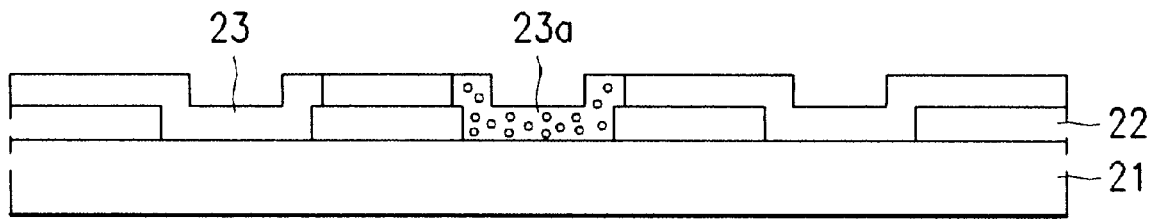

FIGS. 3A–3C illustrate sectional views of a variable circuit connector corresponding to a method for forming that variable circuit connector in accordance with a second preferred embodiment of the present invention. In the second embodiment, no mask is used in injecting N type or P type ions selectively into the insulating layer 23. In fact, the process of forming an insulating layer on an entire surface inclusive of the connecting layers is the same with the first embodiment.

Referring to FIG. 3A, a plurality of connecting layers 22 are formed on a wafer 21. As discussed with respect to FIG. 2A, the plurality of connecting layers 22, being conductors connected on terminals of circuit modules, include pads. Thus, the insulating layer 23 is formed on an entire surface of the wafer 21, inclusive of the plurality of connecting layers 22. The insulating layer 23 is formed of a material, such as silicon oxide or silicon. Portions of the insulating layer 23 are used, where appropriate, as connectors for electrically connecting adjacent connecting layers 22.

Then, as shown in FIG. 3B, an ion beam with a narrow injection width is used to selectively inject ions into only desired portions of the insulating layer 23 between adjacent connecting layers that need to be connected. Though ions are injected into an entire surface using the photoresist as a mask in the first embodiment, an ion beam with a narrow injection width is used to selectively inject ions only into desired portions of the insulating layer 23 in the second embodiment.

Accordingly, as shown in FIG. 3C, when heat treated, the ion injected insulating layer 23 becomes conductive, i.e., becomes connectors 23a, for electrically connecting adjacent connecting layers 22.

Thus, by injecting N or P type ions into the insulating layer 23, the insulating layer 23 can be used to form connectors 23a between adjacent connecting layers 22 that are otherwise electrically separated.

In conclusion, the formation of the connectors by selective injection of ions into a wafer having a plurality of circuit modules formed thereon allows a freedom in forming a circuit system. When it is desired to cut connected circuit modules, ions are selectively injected even in the cutting in the first and second embodiments. For example, the connectors electrically connecting the connecting layers 22 are formed by injecting P type ions into the insulating layer 23, upon injection of N type ions having a conductivity opposite to the P type ions into a required portion of the insulating layer 23, a depletion layer is formed to cut an electrical path. Thus, when the connector is neutralized by injecting ions having a conductivity opposite to the present conductivity of the connector, the electrical path is cut even though the path is not cut physically, and the connecting layers can therefore be isolated or at least separated. In addition, as an alternative, a connection between two adjacent connecting layers may be cut using a laser beam rather than injecting ions having a conductivity opposite to the conductivity of the connector.

The method for forming a variable circuit connector of the present invention has various advantages over conventional connectors, including those noted hereinafter.

First, because connection and cut-off of circuit modules are easy, a span of selection in formation of a system of circuit becomes greater.

Second, as defects are reduced significantly compared to the case when a laser beam or an overcurrent is used, a production yield can be improved.

While there have been illustrated and described what are at present considered to be preferred embodiments of the present invention, it will be understood by those skilled in the art that various changes and modifications may be made, and equivalents may be substituted for elements thereof without departing from the true scope of the present invention. In addition, many modifications may be made to adapt a particular situation or material to the teaching of the present invention without departing from the central scope thereof Therefor, it is intended that the present invention not be limited to the particular embodiment disclosed as the best mode contemplated for carrying out the present invention, but that the present invention includes all embodiments falling within the scope of the appended claims.

The foregoing description and the drawings are regarded as including a variety of individually inventive concepts, some of which may lie partially or wholly outside the scope of some or all of the following claims. The fact that the applicant has chosen at the time of filing of the present application to restrict the claimed scope of protection in accordance with the following claims is not to be taken as a disclaimer of alternative inventive concepts that are included in the contents of the application and could be defined by claims differing in scope from the following claims, which different claims may be adopted subsequently during prosecution, for example, for the purposes of a continuation or divisional application.

What is claimed is:

1. A method for forming a variable circuit connector in a wafer having a plurality of circuit modules, the method comprising:

forming an insulating layer on an entire surface of the wafer and over a plurality of connecting layers connected to terminals on the circuit modules; and injecting conductive ions into at least one selected portion of the insulating layer positioned between at least two of the connecting layers to electrically connect said at least two connecting layers of said circuit modules.

2. A method as claimed in claim 1, wherein the insulating layer is formed of at least one of silicon oxide and silicon.

3. A method for forming a variable circuit connector in a wafer having a plurality of circuit modules, the method comprising:

forming an insulating layer on an entire surface of the wafer including a plurality of connecting layers connected to terminals on the circuit modules;

selectively exposing portions of the insulating layer that are located between the connecting layers and that are intended for interconnection; and injecting conductive ions into exposed surfaces of the insulating layer and the wafer to convert the portions of the insulating layer having the ions injected thereinto into conductive connectors between the connecting layers.

4. A method as claimed in claim 3, wherein the selectively exposing includes:

coating a photoresist film on an entire surface of the wafer including the insulating layer, and patterning the photoresist film to expose a first insulating layer between the connecting layers intended for interconnection.

5. A method as claimed in claim 4, further comprising:

injecting conductive ions into an entire surface after the patterning the photoresist film.

6. A method as claimed in claim 3, wherein the insulating layer is formed of a material including at least one of silicon oxide and silicon.

7. A method as claimed in claim 3, further comprising:

injecting second ions of a conductivity opposite to a conductivity of the conductive connectors, wherein the conductive connectors then become insulating to prevent electrical conductivity when the second ions are injected therein.

8. A method for forming a variable circuit connector in a wafer having a plurality of circuit modules, the method composing:

forming an insulating layer on an entire surface of the wafer including a plurality of connecting layers connected to terminals on the circuit modules; and selectively directing an ion beam with a narrow injection width into portions of the insulating layer between respective pairs of the connecting layers intended for interconnection, without using a mask, to convert the portions into conductive connectors and thus electrically connect said respective pairs of connecting layers.

9. A method as claimed in claim 8, wherein the insulating layer is formed of a material including at least one of silicon oxide and silicon.

10. A method as claimed in claim 8, further comprising:

injecting second ions of a conductivity opposite to a conductivity of the conductive connectors, wherein the conductive connectors become insulating to prevent electrical conductivity when the second ions are injected therein.

11. A method as claimed in claim 10, wherein the second ions neutralize the conductive connectors, thereby blocking a flow of a charge.

* * * * *